(12) United States Patent
Beer et al.

(10) Patent No.: US 6,657,452 B2
(45) Date of Patent: Dec. 2, 2003

(54) CONFIGURATION FOR MEASUREMENT OF INTERNAL VOLTAGES OF AN INTEGRATED SEMICONDUCTOR APPARATUS

(75) Inventors: Peter Beer, München (DE); Carsten Ohlhoff, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/740,633

(22) Filed: Dec. 18, 2000

(65) Prior Publication Data

US 2001/0005143 A1 Jun. 28, 2001

(30) Foreign Application Priority Data

Dec. 17, 1999 (DE) .......................... 199 61 107

(51) Int. Cl.[7] .......................... G01R 31/26; G01R 31/02
(52) U.S. Cl. .................... 324/765; 324/763; 324/158.1
(58) Field of Search ................................. 324/765, 769, 324/73.1, 763; 365/226; 327/535, 538; 714/721, 723

(56) References Cited

U.S. PATENT DOCUMENTS

| | | | | |
|---|---|---|---|---|
| 4,291,404 A | * | 9/1981 | Steiner | |
| 5,349,559 A | * | 9/1994 | Park et al. | 365/201 |
| 5,640,118 A | * | 6/1997 | Drouot | 327/306 |
| 5,717,652 A | * | 2/1998 | Ooishi | 365/233 |
| 5,841,271 A | * | 11/1998 | Nakayama | 323/316 |
| 5,995,011 A | * | 11/1999 | Kurihara et al. | 340/663 |
| 6,232,759 B1 | * | 5/2001 | Wohlfarth | 324/73.1 |
| 6,339,357 B1 | * | 1/2002 | Yamasaki et al. | 327/538 |

FOREIGN PATENT DOCUMENTS

DE 198 19 495 A1 3/1999

OTHER PUBLICATIONS

"Comparators" by H. Engel and R. Shciffel (English Translation), 1984, pp. 49–52.*

H. Engel et al.: Komparatoren [comparators], *Funkschau*, No. 2, 1984, pp. 49–52.

* cited by examiner

*Primary Examiner*—Ernest Karlsen
*Assistant Examiner*—Paresh Patel
(74) *Attorney, Agent, or Firm*—Laurence A. Greenberg; Werner H. Stemer; Ralph E. Locher

(57) ABSTRACT

The invention relates to a configuration for the measurement of internal voltages in a DUT (2), in which a comparator (3) is provided in each DUT (2) and compares the internal voltage (Vint) to be measured with an externally supplied reference voltage (Vref).

10 Claims, 1 Drawing Sheet

CONFIGURATION FOR MEASUREMENT OF INTERNAL VOLTAGES OF AN INTEGRATED SEMICONDUCTOR APPARATUS

BACKGROUND OF THE INVENTION

Field of the Invention

The present invention relates to a configuration for the measurement of internal voltages in an integrated semiconductor apparatus.

Various internal voltages, which may have values of, for example, 2.3 V, 3.5 V, 0.9 V etc., are required in integrated semiconductor apparatuses, such as memory chips etc. These internal voltages in an integrated semiconductor apparatus must be checked before these apparatuses are delivered to ensure that the integrated semiconductor apparatus operates reliably. In the past, testers have been used for this purpose, each of which contains a DC voltage unit ("DC Unit") that applies a known DC voltage (reference voltage) to the semiconductor apparatus, that is to say a memory chip for example. Such a tester would at the same time measure the internal voltage to be checked. In the above example, an internal voltage of 2.3 V, 3.5 V or 0.9 V would be measured on a pad (contact cushion), that is suitable for this purpose, of the semiconductor apparatus.

The semiconductor apparatuses to be tested, also referred to as DUTs ("Device Under Test") now require as many DC voltage units as DUTs in order to perform parallel measurements; each DUT is allocated its own DC voltage unit for the parallel measurement.

If the goal is to test the internal voltages in a large number of semiconductor apparatuses, such as SDRAMs, then an equally large number of DC voltage units are required in the tester in order to perform parallel measurements. Such parallel measurement is a precondition for a short measurement time, and this makes the tester extremely complex.

SUMMARY OF THE INVENTION

It is accordingly an object of the invention to provide a configuration and a method for the measurement of internal voltages in an integrated semiconductor apparatus which overcomes the above-mentioned disadvantageous of the prior art configurations and methods of this general type, and that enables a large number of such integrated semiconductor apparatuses to be measured in parallel, with a low level of complexity.

With the foregoing and other objects in view there is provided, in accordance with the invention, a configuration for measuring an internal voltage in an integrated semiconductor apparatus. The configuration includes a tester supplying a reference voltage, and a semiconductor apparatus having an internal voltage to be measured and a comparator with a first input, a second input, and an output. The first input of the comparator has the internal voltage to be measured applied thereto. The second input of the comparator has the reference voltage applied thereto, and the output of the comparator is connected to the external tester. The tester is disposed external from the semiconductor apparatus and is configured to determine whether the internal voltage matches or does not match the reference voltage.

The reference voltage can be supplied to the comparator in discrete voltage steps, or as a ramp signal.

The invention thus departs completely from the approach used in the previous prior art; the comparator which compares the internal voltage (Vint) to be measured with a reference voltage (Vref) is moved to the semiconductor apparatus, that is to say to the DUT so that a large number of semiconductor apparatuses or DUTs can be measured in parallel directly, by comparing the one externally supplied reference voltage with the corresponding internal voltage in the respective semiconductor apparatuses. The additional complexity for the comparator is relatively low, and requires only a small surface area on the integrated semiconductor apparatus.

The reference voltage is applied via a pad or contact cushion, and this reference voltage together with the internal voltage to be measured is passed to the inputs of the comparator that is provided in the semiconductor apparatus. The output from this comparator is passed to the outside. This means that the reference voltage is supplied from an external tester, which also records the output signal from the comparator. The output signal can in this case be output directly to the external tester, via a suitable pad. Alternatively, a suitable monitoring signal (for example "high"=Vint is greater than Vref; "low"=Vint is less than Vref) could also be output via one of the existing input/output channels of the semiconductor apparatus.

If, for example, the output signal from the comparator is at a high level, then this may mean that the internal voltage is less than the reference voltage. On the other hand, if the output signal from the comparator is at a low level, then this means that the internal voltage is higher than the reference voltage.

In order now to measure the internal voltage, one option is to apply the reference voltage in discrete voltage steps, with an external check being carried out with the tester after each voltage step to determine whether the values of the internal voltage and of the reference voltage have already crossed. If such a crossover occurs, then this means that the internal voltage matches the external reference voltage with the accuracy provided by the step widths.

Another option is to apply the reference voltage to the comparator as a ramp signal. In this case, the internal voltage in the semiconductor apparatus corresponds to the reference voltage at the time at which the output from the comparator signals that the internal voltage and the reference voltage have crossed over.

The comparator is preferably a differential amplifier. However, it is, of course possible, to choose any circuit for the comparator which is able to compare the external reference voltage with the internal voltage to be measured.

With the foregoing and other objects in view there is also provided, in accordance with the invention, a method for testing a plurality of integrated semiconductor components, which comprises steps of: providing each of a plurality of integrated semiconductor components with an input for receiving a reference voltage; connecting the input of each of the plurality of integrated semiconductor components in parallel and supplying the reference voltage to each input; for each of the plurality of integrated semiconductor components, measuring a magnitude of a respective internal voltage by comparing the reference voltage with the respective internal voltage; and identifying operability of a respective one of the plurality of integrated semiconductor components as a function of the measured magnitude of the respective internal voltage.

In accordance with an added mode of the invention, a voltage generator which produces the internal voltage is corrected as a function of the measured internal voltage.

Other features which are considered as characteristic for the invention are set forth in the appended claims.

Although the invention is illustrated and described herein as embodied in a configuration for measurement of internal voltages in an integrated semiconductor apparatus, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
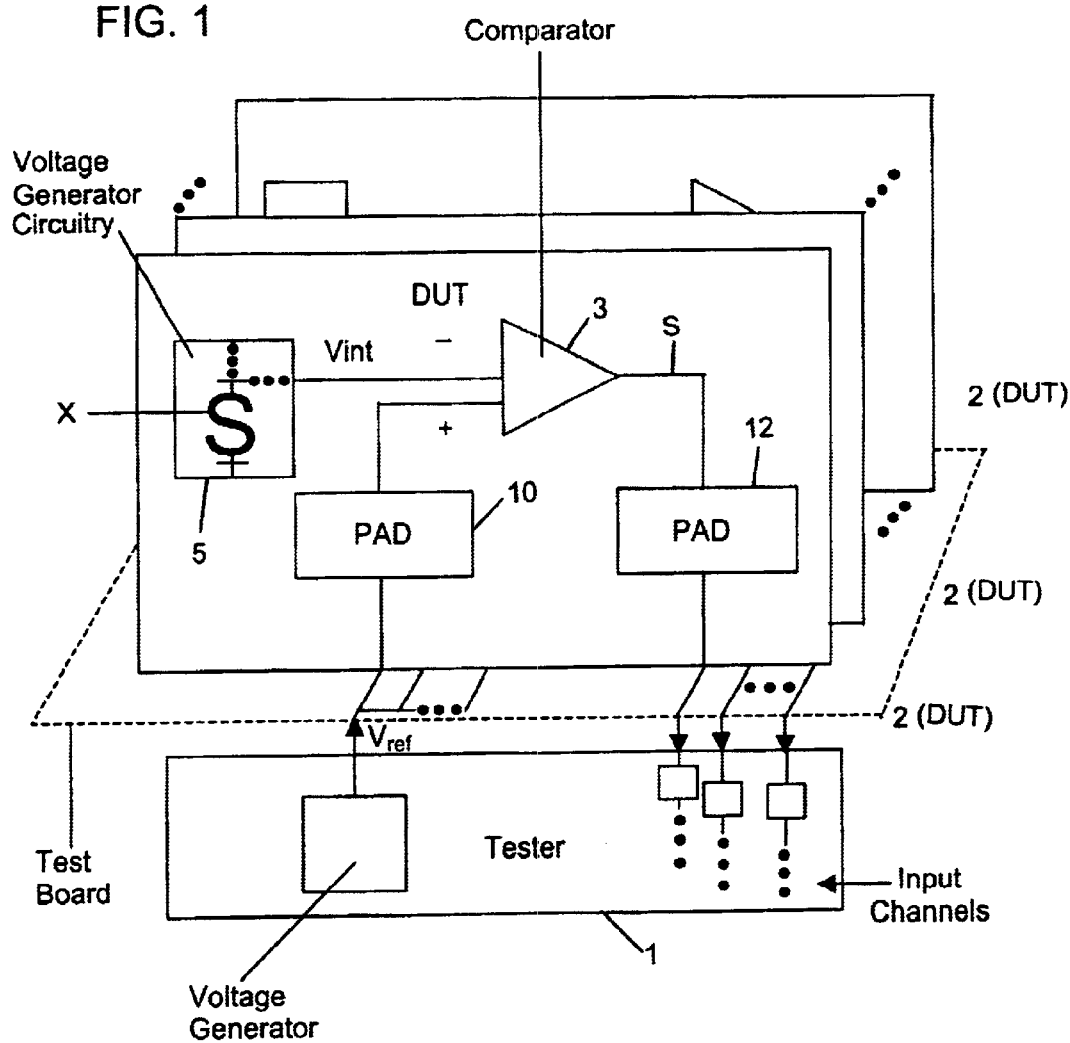
FIG. 1 shows a block diagram of a configuration for measuring internal voltages.

Referring now to the sole drawing figure, FIG. 1, in detail, there is shown an external tester 1 and a semiconductor apparatus (DUT) 2. One output of the external tester 1 supplies a reference voltage Vref to an input or pad 10 of the semiconductor apparatus (DUT) 2, in which a differential amplifier 3 is integrated as a comparator. An internal voltage Vint to be measured is applied to one input of this differential amplifier 3, while the reference voltage Vref is supplied to the other input of the differential amplifier 3. The output signal from the differential amplifier 3 is supplied to the external tester 1 via an appropriate pad 12. The internal voltage Vint is obtained from the voltage generator 5 disposed in the semiconductor apparatus.

The reference voltage Vref may be applied to the differential amplifier 3 either as a stepped signal in discrete voltage steps, or as a continuous ramp signal. As soon as the reference voltage Vref crosses the internal voltage Vint, the output signal from the differential amplifier 3 switches from "high" to "low", or vice versa. This makes it possible to accurately define a match between the reference voltage and the internal voltage, that is to say the magnitude of the internal voltage.

The reference voltage may, of course, be supplied in parallel to a large number of semiconductor apparatuses (DUTs), and their output signals can be recorded by the tester 1. This means that a large number of semiconductor apparatuses can be tested in parallel, directly, using only one reference voltage.

Furthermore, the reference voltage supplied by the tester 1 may also be variable, so that the tester 1 can emit, for example, reference voltages of 2.3 V, 3.5 V and 0.9 V.

If a reference voltage is applied in voltage steps, then the measurement accuracy becomes greater. Of course, the smaller the individual steps, the greater the accuracy. Better accuracy than this can be achieved by using a ramp signal as the reference voltage since, in that case, the crossover between the reference voltage and the internal voltage can be measured accurately.

The configuration according to the invention allows a large number of integrated semiconductor chips to be tested in parallel. The semiconductor chips for testing are normally configured on a test board. The tester uses a single voltage generator to produce a single reference voltage with a ramp profile, which is supplied to all the chips which are to be tested in parallel. Since only a limited number of voltage generators are available on the tester, resources are saved there. Each of the chips to be tested emits a digital pulse via the internal-chip comparator 3. To receive these digital pulses, the tester has a large number of input channels. The invention thus makes it possible to test a large number of chips in parallel without any problems.

As an example, let the nominal value of the voltage to be tested be 2.3 V. Those chips are found to be good whose internal voltage is within a tolerance band around 2.3 V, for example from 2.2 V to 2.4 V. Chips which supply internal voltages Vint outside this tolerance band are rejected as being unusable. If necessary, voltage generators 5 inside the chip 2 can be readjusted, that is to say trimmed, depending on the measurement result. The trimming is carried out by connecting or disconnecting reference elements within the voltage generators 5 with fuses. A generator 5 which produces the internal voltage Vint is in this way corrected, that is to say trimmed.

Figure 2:
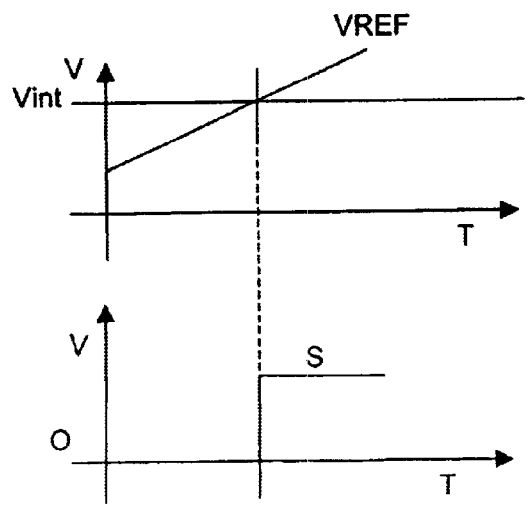
FIG. 2 shows the output of the comparator as the reference voltage is increased.

FIG. 2 shows the output signal S of the differential amplifier 3 as the reference voltage VREF is increased from a value below the internal voltage VINT to a value above the internal voltage VINT. In FIG. 2, the output signal S of the differential amplifier 3 makes a transition from a low voltage to a high voltage when the reference voltage VREF crosses the internal voltage VINT, however, it should be understood that the differential amplifier 3 could be connected such that the output signal S makes the opposite transition.

We claim:

1. A configuration for measuring an internal voltage in an integrated semiconductor apparatus, which comprises:

a tester having a voltage generator supplying a reference voltage; and a plurality of semiconductor apparatuses, each one of said plurality of semiconductor apparatuses having a respective internal voltage to be measured and a comparator with a first input, a second input, and an output, said first input of said comparator of each one of said plurality of semiconductor apparatuses having the respective internal voltage to be measured applied thereto, said second input of said comparator of each one of said plurality of semiconductor apparatuses connected to said voltage generator of said tester for receiving the reference voltage, said output of said comparator of each one of said plurality of semiconductor apparatuses connected to said tester;

said tester disposed external from each one of said plurality of semiconductor apparatuses and configured to determine whether the internal voltage of each one of said plurality of semiconductor apparatuses matches or does not match the reference voltage; and said voltage generator of said tester supplying the reference voltage to said comparator of each one of said plurality of semiconductor apparatuses in discrete voltage steps;

said tester having a plurality of input channels;

said output of said comparator of each one of said plurality of semiconductor apparatuses being connected to a respective one of said plurality of input channels; and said tester supplying the reference voltage to each one of said plurality of semiconductor apparatuses in parallel.

2. The configuration according to claim 1, wherein at least one of said plurality of said semiconductor apparatuses includes a pad for receiving the reference voltage.

3. The configuration according to claim 1, wherein said output of said comparator of one of said plurality of semiconductor apparatuses supplies a signal that makes a transition when the reference voltage crosses the internal voltage, said transition selected from the group consisting of transition from a high level to a low level and a transition from a low level to a high level.

4. The configuration according to claim 1, wherein said comparator of one of said plurality of semiconductor apparatuses is a differential amplifier.

5. A method for testing a plurality of integrated semiconductor components, which comprises:

providing each of a plurality of integrated semiconductor components with an input for receiving a reference voltage;

connecting the input of each of the plurality of integrated semiconductor components in parallel to an output of a voltage generator of a tester and supplying the reference voltage to each input;

for each of the plurality of integrated semiconductor components, measuring a magnitude of a respective internal voltage by comparing the reference voltage with the respective internal voltage;

feeding an output signal of each one of the plurality of integrated semiconductor components that is generated by comparing the reference voltage with the respective internal voltage to a respective input channel of the tester; and identifying operability of a respective one of the plurality of integrated semiconductor components as a function of the measured magnitude of the respective internal voltage.

6. The method according to claim 5, which comprises correcting a voltage generator which produces the internal voltage as a function of the measured internal voltage.

7. A configuration for measuring an internal voltage in an integrated semiconductor apparatus, which comprises:

a tester having a voltage generator supplying a reference voltage; and a plurality of semiconductor apparatuses, each one of said plurality of semiconductor apparatuses having a respective internal voltage to be measured and a comparator with a first input, a second input, and an output, said first input of said comparator of each one of said plurality of semiconductor apparatuses having the respective internal voltage to be measured applied thereto, said second input of said comparator of each one of said plurality of semiconductor apparatuses connected to said voltage generator of said tester for receiving the reference voltage, said output of said comparator of each one of said plurality of semiconductor apparatuses connected to said tester;

said tester disposed external from each one of said plurality of semiconductor apparatuses and configured to determine whether the internal voltage of each one of said plurality of semiconductor apparatuses matches or does not match the reference voltage; and said voltage generator of said tester supplying the reference voltage to said comparator of each one of said plurality of semiconductor apparatuses as a ramp signal;

said tester having a plurality of input channels;

said output of said comparator of each one of said plurality of semiconductor apparatuses being connected to a respective one of said plurality of input channels; and said tester supplying the reference voltage to each one of said plurality of semiconductor apparatuses in parallel.

8. The configuration according to claim 7, wherein at least one of said plurality of said semiconductor apparatuses includes a pad for receiving the reference voltage.

9. The configuration according to claim 7, wherein said output of said comparator supplies a signal that makes a transition when the reference voltage crosses the internal voltage, said transition selected from the group consisting of transition from a high level to a low level and a transition from a low level to a high level.

10. The configuration according to claim 7, wherein:

said tester has a plurality of input channels;

said output of said comparator of each one of said plurality of said semiconductor apparatuses is connected to a respective one of said plurality of said input channels; and said tester supplies the reference voltage to each one of said plurality of said semiconductor apparatuses in parallel.

* * * * *

UNITED STATES PATENT AND TRADEMARK OFFICE
CERTIFICATE OF CORRECTION

PATENT NO. : 6,657,452 B2
DATED : December 2, 2003
INVENTOR(S) : Peter Beer et al.

It is certified that error appears in the above-identified patent and that said Letters Patent is hereby corrected as shown below:

Drawings,
Figure 1, should appear as follows:

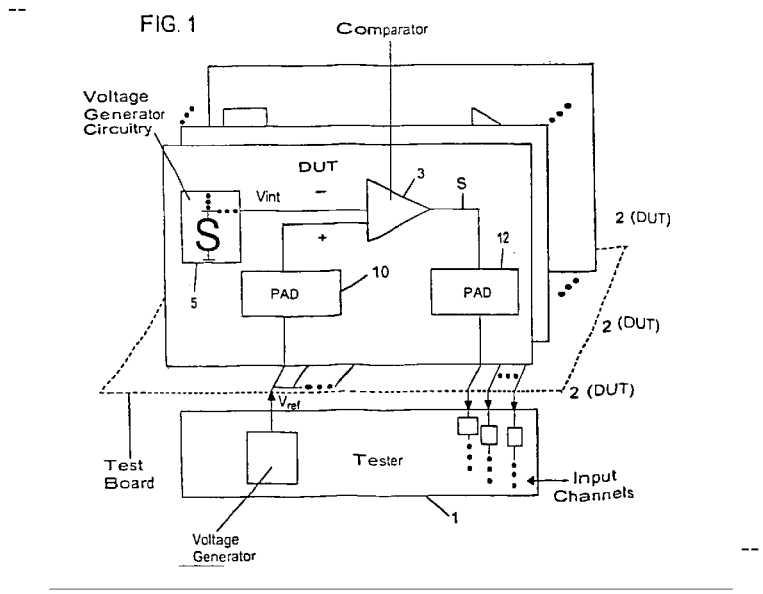

Signed and Sealed this

Twenty-fourth Day of August, 2004

JON W. DUDAS
*Director of the United States Patent and Trademark Office*